United States Patent
Chen et al.

(10) Patent No.: US 9,978,457 B1
(45) Date of Patent: May 22, 2018

(54) METHOD FOR OPERATING MEMORY ARRAY

(71) Applicant: MACRONIX INTERNATIONAL CO., LTD., Hsinchu (TW)

(72) Inventors: Yung-Hsiang Chen, Taipei (TW); Yao-Wen Chang, Zhubei (TW); I-Chen Yang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days. days.

(21) Appl. No.: 15/358,300

(22) Filed: Nov. 22, 2016

(51) Int. Cl.
*G11C 16/04* (2006.01)
*G11C 16/34* (2006.01)
*G11C 16/10* (2006.01)

(52) U.S. Cl.
CPC ...... *G11C 16/3427* (2013.01); *G11C 16/0483* (2013.01); *G11C 16/10* (2013.01); *G11C 16/3422* (2013.01)

(58) Field of Classification Search
CPC .................................................. G11C 16/3427
USPC ...................................................... 365/185.02
See application file for complete search history.

(56) References Cited

U.S. PATENT DOCUMENTS

| | | | | |
|---|---|---|---|---|
| 7,064,980 B2 * | 6/2006 | Cernea | ............... | G11C 11/5628 365/185.11 |
| 7,215,574 B2 * | 5/2007 | Khalid | ............... | G11C 16/3468 365/185.12 |
| 8,130,556 B2 * | 3/2012 | Lutze | ............... | G11C 16/0483 365/185.17 |
| 8,422,297 B2 * | 4/2013 | Tamada | ............... | G11C 11/5628 365/185.02 |
| 9,147,471 B2 * | 9/2015 | Lee | ............... | G11C 16/0483 |
| 9,165,658 B2 * | 10/2015 | Sarpatwari | ......... | G11C 16/0483 |
| 9,343,169 B2 | 5/2016 | Vali et al. | | |
| 2002/0114187 A1 | 8/2002 | Choi et al. | | |
| 2004/0027894 A1 | 2/2004 | Lee et al. | | |
| 2008/0158991 A1 | 7/2008 | Hemink et al. | | |
| 2013/0121071 A1 * | 5/2013 | Sarin | ............... | G11C 16/04 365/185.02 |
| 2016/0093384 A1 | 3/2016 | Lee | | |

OTHER PUBLICATIONS

Lee, et al.: "A 64Gb 533Mb/s DDR Interface MLC NAND Flash in Sub-20nm Technology"; ISSCC 2012 / Session 25 / Non-Volatile Memory Solutions / 25.5; pp. 430-432.
TW Office Action dated Jul. 6, 2017 in Taiwan application (No. 105133168).

* cited by examiner

*Primary Examiner* — Son Mai
(74) *Attorney, Agent, or Firm* — McClure, Qualey & Rodack, LLP

(57) ABSTRACT

A method for operating a memory array is disclosed. The memory array includes a first memory cell, a second memory cell and a third memory cell sharing a gate and arranged along an extending direction of the gate in order. The method includes the following steps. A first bias is applied to a channel of the first memory cell to program the first memory cell. A second bias is applied to a channel of the second memory cell to inhibit programming of the second memory cell. A third bias is applied to a channel of the third memory cell to program or inhibit programming of the third memory cell. The first bias and the third bias are different.

12 Claims, 4 Drawing Sheets

METHOD FOR OPERATING MEMORY ARRAY

BACKGROUND

Technical Field

The disclosure relates to a method for operating a memory array, and particularly to a method for operating a NAND flash memory array.

Description of the Related Art

As critical dimensions of devices in integrated circuits shrink toward perceived limits of manufacturing technologies, designers have been looking to techniques to achieve greater storage capacity, and to achieve lower costs per bit. Technologies being pursued include a NAND memory and an operation performed therefor. However, state characteristics of adjacent memory cells would be affected by disturbance from each other. Especially, the problem becomes serious as a size and a pitch for memory cells shrink with a technical trend.

SUMMARY

The present disclosure relates to a method for operating a memory array.

According to an embodiment, a method for operating a memory array is disclosed. The memory array comprises a first memory cell, a second memory cell and a third memory cell sharing a gate and arranged along an extending direction of the gate in order. The method comprises the following steps. A first bias is applied to a channel of the first memory cell to program the first memory cell. A second bias is applied to a channel of the second memory cell to inhibit programming of the second memory cell. A third bias is applied to a channel of the third memory cell to program or inhibit programming of the third memory cell. The first bias and the third bias are different.

According to an embodiment, a method for operating a memory array is disclosed, which comprises the following steps. A first bit line bias is applied to program a first memory cell of a first memory string. A second bit line bias is applied to inhibit programming a second memory cell of a second memory string. A third bit line bias is applied to program or inhibit programming a third memory cell of a third memory string. The first bit line bias is different from the third bit line bias. The first memory cell, the second memory cell and the third memory cell are arranged in a page of the memory array in sequence.

The above and other embodiments of the disclosure will become better understood with regard to the following detailed description of the non-limiting embodiment(s). The following description is made with reference to the accompanying drawings.

DETAILED DESCRIPTION

Embodiments of the present disclosure provide an operating method for a memory array, which can improve characteristics of a device.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

In embodiments, one of two memory cells on opposing sides of a memory cell in a program inhibited state, in the same page (for example along an extending direction of a gate or word line), has a higher channel bias which can boost a channel potential of the memory cell in the program inhibited state and thus stabilize the program inhibited state. For example, one of two memory cells on opposing sides of a memory cell in a program inhibited state is set to be in a program inhibited state, while the other of two memory cells is set to be in a programmed state. Otherwise, the two memory cells on opposing sides of a memory cell in a program inhibited state are set to be in programmed states respectively with different channel/bit line biases wherein one of the biases is higher than the other.

The following embodiments are taken to illustrate the operating method for the memory array. For easy and clear understanding, discussed elements are named according to portions of the memory array, biases applied thereto, and/or states of memory cells in the operating method. For example, a bias V1 may be also referred to as a first bias or a first bit line bias, and a memory cell corresponding to the bias V1 may be also referred to as a first memory cell or a first memory cell corresponding to a first memory string and so forth.

Figure 1:
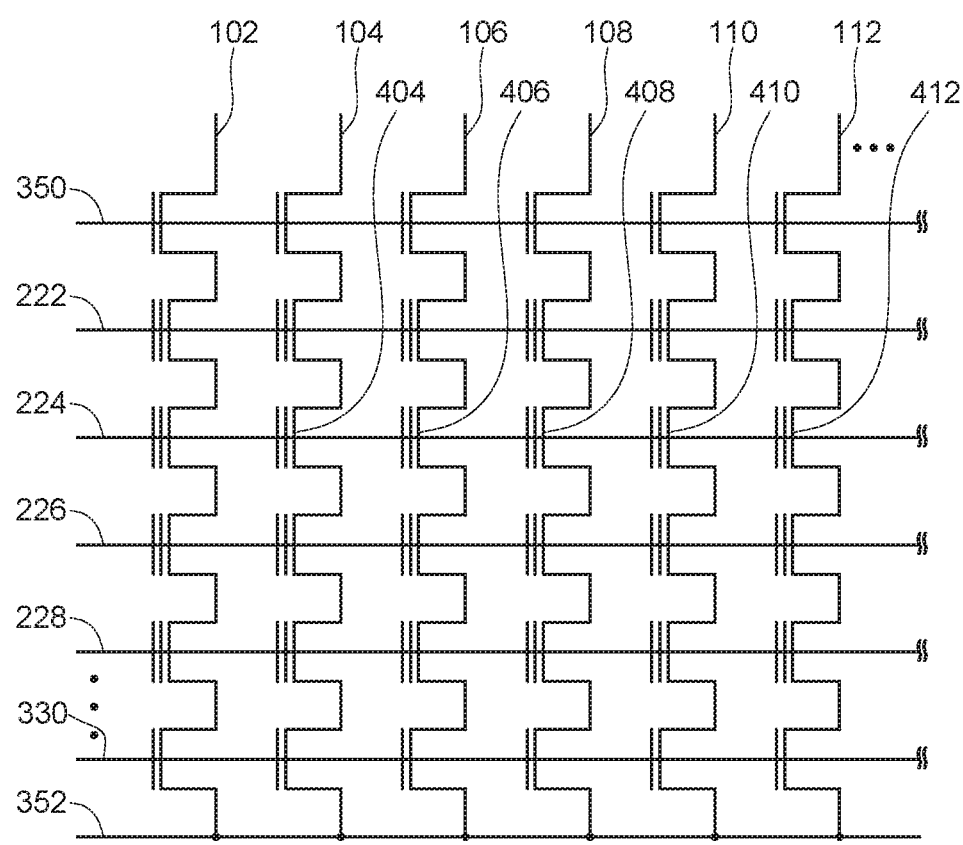
FIG. 1 illustrates a memory array according to an embodiment.

FIG. 1 illustrates a memory array according to an embodiment. For example, NAND strings correspond bit lines (or channels) 102, 104, 106, 108, 110, 112, respectively. Memory cells (such as 404, 406, 408, 410, 412, etc) are defined at cross-points between the bit lines 102, 104, 106, 108, 110, 112 and gates 222, 224, 226, 228. Two opposing sides of a string of the memory cells of the NAND strings may be coupled to string select transistors corresponding to gates 330, 350. Ends of the NAND strings opposing to the bit lines 102, 104, 106, 108, 110, 112 may be coupled to a source 352.

Figure 2:
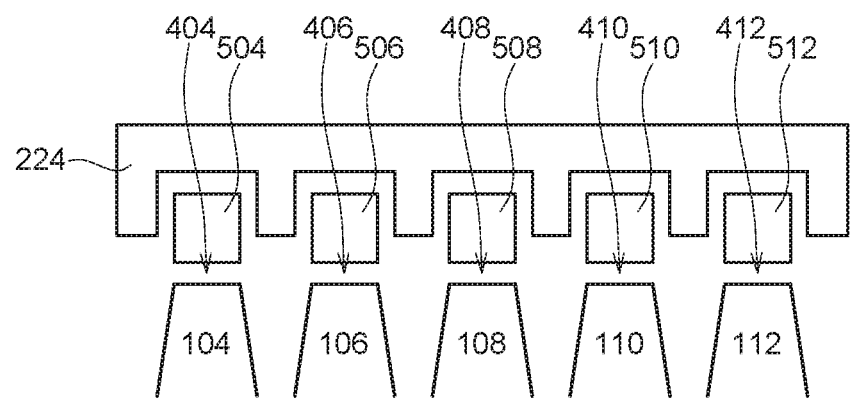
FIG. 2 illustrates a portion structure of a memory array according to an embodiment.

FIG. 2 illustrates the memory cells 404, 406, 408, 410, 412 of a portion of the memory array in FIG. 1, which are in the same page and arranged along an extending direction of the commonly used gate 224. The memory cells 404, 406, 408, 410, 412 are defined at cross-points between the gate 224 and the bit lines 104, 106, 108, 110, 112. The memory array may comprise a dielectric (such as a memory film, not shown) disposed between the gate 224, and the bit lines 104, 106, 108, 110, 112 and floating gate 504, 506, 508, 510, 512. The dielectric (or the memory film) may comprise silicon oxide, silicon nitride, such as an ONO memory structure, or an ONONO memory structure, or other suitable materials or structures.

Figure 7:
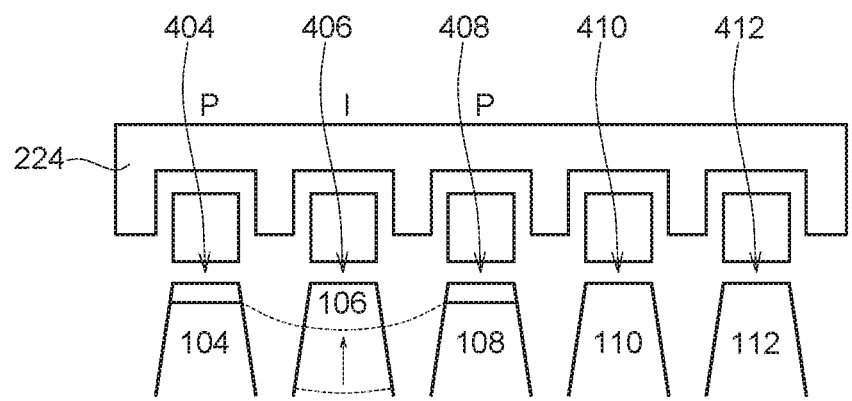
FIG. 7 illustrates an operating method of a comparative example.

FIG. 7 illustrates an operating method of a comparative example. The memory cell 404 and the memory cell 408 are in a programmed state P by biases (0V) applied to the bit line/channel. The memory cell 406 in a program inhibited state I by a bias (3.3V) applied to the bit line/channel is affected by the two adjacent side memory cell 404 and memory cell 408 in the programmed state P by the lower bias 0V, and thus have a lower boosted degree of a channel potential. As shown in the figure, a ground-biased equal-potential line is shallow, and it would compress a depletion depth and enhance an electric field, and thus increase a current leakage and lower the boosted channel potential. Therefore, the inhibited state would be unstable. Moreover, capacitances between the bit lines would further decrease the boosted degree of the potential.

Figure 3:
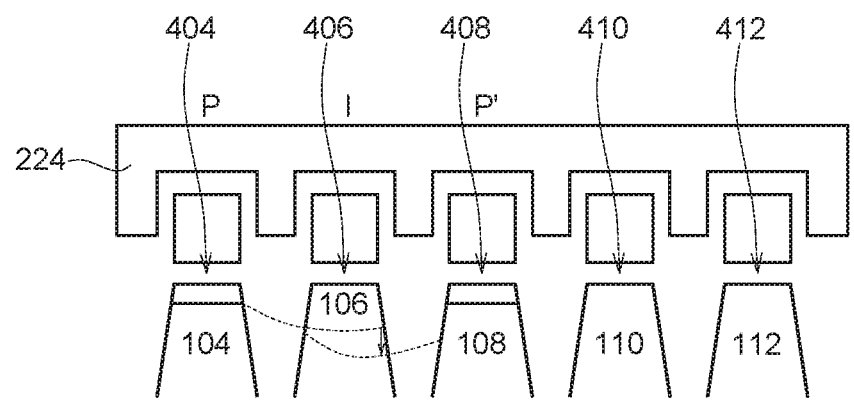
FIG. 3 illustrates an operating method according to an embodiment.

Referring to FIG. 3, in an operating method according to an embodiment, the (first) memory cell 404 is programmed to be in a programmed state P with a bias V1 (first bias or first bit line bias) providing to the bit line 104 (corresponding to a channel of a first memory string or a first bit line). The (second) memory cell 406 is inhibited as being in a program inhibited state I with a bias V2 (second bias or second bit line bias) providing to the bit line 106 (corresponding to a channel of a second memory string or a second bit line). The (third) memory cell 408 is programmed to be in a programmed state P' with a bias V3 (third bias or third bit line bias) providing to the bit line 108 (corresponding to a channel of a third memory string or a third bit line). The bias V3 is different from the bias V1. In an embodiment, for example, the bias V2 is higher than the bias V1 and the bias V3, and the bias V3 is higher than the bias V1. The bias V1 may be a positive voltage or 0V. In an embodiment, for example, the bias V1 is 0V, the bias V2 is a Vcc, such as 3.3V, and the bias V3 is 1V. The memory cell 408 in the programmed state P' with the bias V3 higher than the bias V1 increases a depth of a ground-biased equal-potential line of the neighboring the memory cell 406, and thus boost a channel potential of the memory cell 406 to have a program inhibited state more stable than the comparative example.

Figure 4:
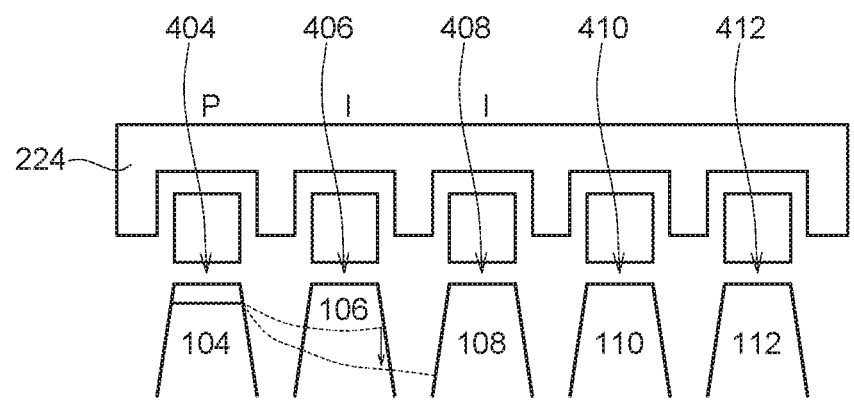
FIG. 4 illustrates an operating method according to an embodiment.

Referring to FIG. 4, in an operating method according to an embodiment, the memory cell 404 is in a programmed state P. The memory cell 406 is in a program inhibited state I. The memory cell 408 is in a program inhibited state I. In an embodiment, for example, the bias V2 applied to inhibit programming of the memory cell 406 is equal to the bias V3 applied to inhibit programming of the memory cell 408, and is higher than the bias V1 applied to program the memory cell 404. The bias V1 may be a positive voltage or 0V. In an embodiment, for example, the bias V1 is 0V, and the bias V2 and the bias V3 are Vcc such as 3.3V. The memory cell 408 in the program inhibited state I with the bias V3 higher than the bias V1 increases a depth of a ground-biased equal-potential line of the neighboring the memory cell 406, and thus boost a channel potential of the memory cell 406 to have a program inhibited state more stable than the comparative example.

Figure 5:
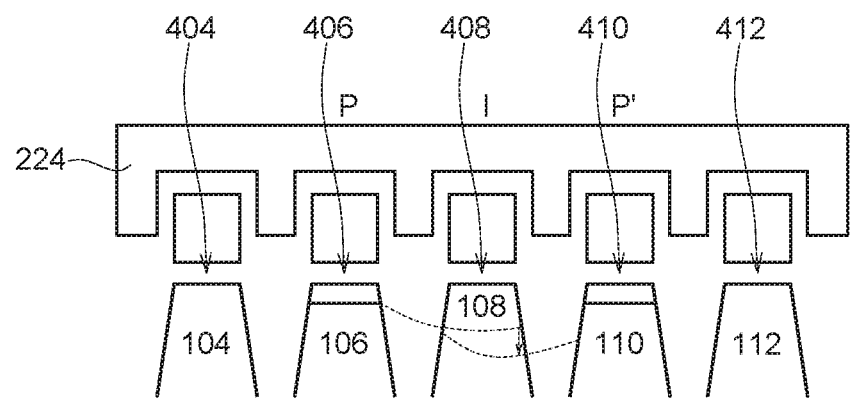
FIG. 5 illustrates an operating method according to an embodiment.

Referring to FIG. 5, in an operating method according to an embodiment, the (first) memory cell 406 is programmed to be in a programmed state P with a bias V1 (first bias or first bit line bias) providing to the bit line 106 (corresponding to a channel of a first memory string or a first bit line). The (second) memory cell 408 is inhibited as being in a program inhibited state I with a bias V2 (second bias or second bit line bias) providing to the bit line 108 (corresponding to a channel of a second memory string or a second bit line). The (third) memory cell 410 is programmed to be in a programmed state P' with a bias V3 (third bias or third bit line bias) providing to the bit line 110 (corresponding to a channel of a third memory string or a third bit line). The bias V3 is different from the bias V1. In an embodiment, for example, the bias V2 is higher than the bias V1 and the bias V3, and the bias V3 is higher than the bias V1. The bias V1 may be a positive voltage or 0V. In an embodiment, for example, the bias V1 is 0V, the bias V2 is a Vcc, such as 3.3V, and the bias V3 is 1V. The memory cell 410 in the programmed state P' with the bias V3 higher than the bias V1 increases a depth of a ground-biased equal-potential line of the neighboring the memory cell 408, and thus boost a channel potential of the memory cell 408 to have a program inhibited state more stable than (the memory cell 406 in FIG. 7 of) the comparative example.

Figure 6:
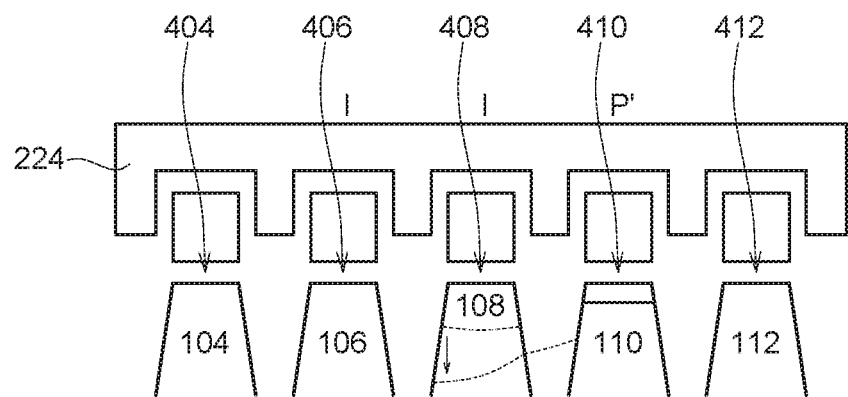
FIG. 6 illustrates an operating method according to an embodiment.

Referring to FIG. 6, in an operating method according to an embodiment, the (first) memory cell 410 is in a programmed state P'. The (second) memory cell 408 is in a program inhibited state I. The (third) memory cell 406 is in a program inhibited state I. In an embodiment, for example, the bias V2 applied to inhibit programming of the memory cell 408 is equal to the bias V3 applied to inhibit programming of the memory cell 406, and is higher than the bias V1 applied to program the memory cell 410. The bias V1 may be a positive voltage or 0V. In an embodiment, for example, the bias V1 is 1 V, and the bias V2 and the bias V3 are Vcc such as 3.3V. The memory cells 410 and 406, respectively in the programmed state P' and the program inhibited state I with the biases V1, V3 higher than a normal bias applied to program a memory cell to be in a programmed state P, increase a depth of a ground-biased equal-potential line of the neighboring the memory cell 408, and thus boost a channel potential of the memory cell 408 to have a program inhibited state more stable than (the memory cell 406 in FIG. 7 of) the comparative example.

According to the operating methods of embodiments, a middle memory cell of which a channel potential can be boosted to a higher level is in a more stable program inhibited state, compared to the comparative example.

In embodiments, the bit lines through which the biases V1, V2, V3 are provided belong to different groups of bit line respectively. For example, the bit lines may be designed with an arrangement of 3n+1, 3n+2, 3n+3, or an arrangement of 4n+1, 4n+2, 4n+3, 4n+4, wherein n=0, 1, 2 or other continuous positive integers. The bit lines of the same group are coupled to a common bit line or voltage source.

The operating method according to embodiments can be applied to a selected page in a memory array of a 2D NAND memory string or a 3D memory string.

Accordingly, the operating method according to embodiments can improve the characteristics of the memory array.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a memory array, wherein the memory array comprises a first memory cell, a second memory cell and a third memory cell sharing a gate and arranged along an extending direction of the gate in order, the method for operating the memory array comprises:
   providing a first bias to a channel of the first memory cell to program the first memory cell;
   providing a second bias to a channel of the second memory cell to inhibit programming of the second memory cell; and
   providing a third bias to a channel of the third memory cell to program the third memory cell, wherein the first bias and the third bias are different.

2. The method for operating the memory array according to claim 1, wherein the second bias is higher than the first bias, and is higher than the third bias.

3. The method for operating the memory array according to claim 1, wherein the third bias is higher than the first bias.

4. The method for operating the memory array according to claim 1, wherein the second bias is higher than the third bias.

5. The method for operating the memory array according to claim 1, wherein the first bias is 0V, the second bias and the third bias are positive biases.

6. The method for operating the memory array according to claim 1, wherein while the second memory cell is in a program inhibited state, the first memory cell is a programmed state and the third memory cell is in a programmed state.

7. A method for operating a memory array, comprising:
   providing a first bit line bias to program a first memory cell of a first memory string;
   providing a second bit line bias to inhibit programming a second memory cell of a second memory string; and
   providing a third bit line bias to program a third memory cell of a third memory string, wherein the first bit line bias is different from the third bit line bias, the first memory cell, the second memory cell and the third memory cell are arranged in a page of the memory array in sequence.

8. The method for operating the memory array according to claim 7, wherein the bit line second bias is higher than the first bit line bias, and is higher than the third bit line bias.

9. The method for operating the memory array according to claim 7, wherein the third bit line bias is higher than the first bit line bias.

10. The method for operating the memory array according to claim 7, wherein the second bit line bias is higher than the third bit line bias.

11. The method for operating the memory array according to claim 7, wherein the first bit line bias is 0V, the second bit line bias and the third bit line bias are positive biases.

12. The method for operating the memory array according to claim 7, wherein while the second memory cell is in a program inhibited state, the first memory cell is a programmed state and the third memory cell is in a programmed state.

* * * * *